United States Patent
Yoshikawa

(10) Patent No.: US 11,018,187 B2
(45) Date of Patent: May 25, 2021

(54) MAGNETIC MEMORY DEVICE

(71) Applicant: TOSHIBA MEMORY CORPORATION, Tokyo (JP)

(72) Inventor: Masatoshi Yoshikawa, Seoul (KR)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/353,439

(22) Filed: Mar. 14, 2019

(65) Prior Publication Data
US 2020/0083291 A1    Mar. 12, 2020

(30) Foreign Application Priority Data

Sep. 10, 2018  (JP) ............................. JP2018-168867

(51) Int. Cl.
| H01L 27/22 | (2006.01) |
| H01L 43/10 | (2006.01) |
| H01L 43/08 | (2006.01) |

(52) U.S. Cl.
CPC ............ *H01L 27/228* (2013.01); *H01L 43/08* (2013.01); *H01L 43/10* (2013.01)

(58) Field of Classification Search
CPC ........ H01L 27/228; H01L 43/08; H01L 43/10
See application file for complete search history.

(56) References Cited

U.S. PATENT DOCUMENTS

| 7,750,421 | B2 | 7/2010 | Horng et al. |
| 8,305,801 | B2* | 11/2012 | Daibou ................ H01L 43/10 |
| | | | 365/148 |
| 8,786,036 | B2* | 7/2014 | Cao ...................... H01L 43/00 |
| | | | 257/295 |
| 2006/0228588 | A1* | 10/2006 | Suzuki ................... G11B 5/66 |
| | | | 428/829 |
| 2007/0047140 | A1* | 3/2007 | Tabakovic ............. G11B 5/3113 |
| | | | 360/123.49 |
| 2007/0217071 | A1* | 9/2007 | Inamura ................. G11B 5/66 |
| | | | 360/135 |
| 2008/0182342 | A1* | 7/2008 | Parkin .................. B82Y 10/00 |
| | | | 438/3 |
| 2012/0241827 | A1 | 9/2012 | Daibou et al. |
| 2014/0284539 | A1* | 9/2014 | Eeh ........................ H01L 43/12 |
| | | | 257/4 |
| 2017/0117459 | A1* | 4/2017 | Watanabe ............... H01L 43/10 |
| 2017/0263857 | A1* | 9/2017 | Watanabe ............... H01L 43/10 |
| 2018/0301257 | A1* | 10/2018 | Fujikawa .............. H01F 1/0576 |

FOREIGN PATENT DOCUMENTS

| JP | 2005203702 A | 7/2005 |
| JP | 2012204680 A | 10/2012 |
| JP | 5279384 B2 | 9/2013 |

* cited by examiner

*Primary Examiner* — Christine A Enad
(74) *Attorney, Agent, or Firm* — Holtz, Holtz & Volek PC

(57) ABSTRACT

According to one embodiment, a magnetic memory device includes a first magnetic layer having a variable magnetization direction, a second magnetic layer having a fixed magnetization direction, and a nonmagnetic layer provided between the first magnetic layer and the second magnetic layer, wherein the first magnetic layer includes a first sub-magnetic layer in a polycrystalline state and a second sub-magnetic layer in an amorphous state.

16 Claims, 2 Drawing Sheets

MAGNETIC MEMORY DEVICE

CROSS-REFERENCE TO RELATED APPLICATIONS

This application is based upon and claims the benefit of priority from Japanese Patent Application No. 2018-168867, filed Sep. 10, 2018, the entire contents of which are incorporated herein by reference.

FIELD

Embodiments described herein relate generally to a magnetic memory device.

BACKGROUND

A magnetic memory device (semiconductor integrated circuit device) in which magnetoresistive elements and transistors are integrated on a semiconductor substrate is proposed.

In a magnetic memory device, it is important to reduce the write error rate (WER). For that purpose, it is necessary to reduce variation in characteristics such as variation in write current or the like.

However, heretofore, it could have hardly been said that a magnetic memory device in which variation in write characteristics is reduced has been obtained.

DETAILED DESCRIPTION

In general, according to one embodiment, a magnetic memory device includes: a first magnetic layer having a variable magnetization direction; a second magnetic layer having a fixed magnetization direction; and a nonmagnetic layer provided between the first magnetic layer and the second magnetic layer, wherein the first magnetic layer includes a first sub-magnetic layer in a polycrystalline state and a second sub-magnetic layer in an amorphous state.

Hereinafter, an embodiment will be described with reference to the accompanying drawings.

Figure 1:
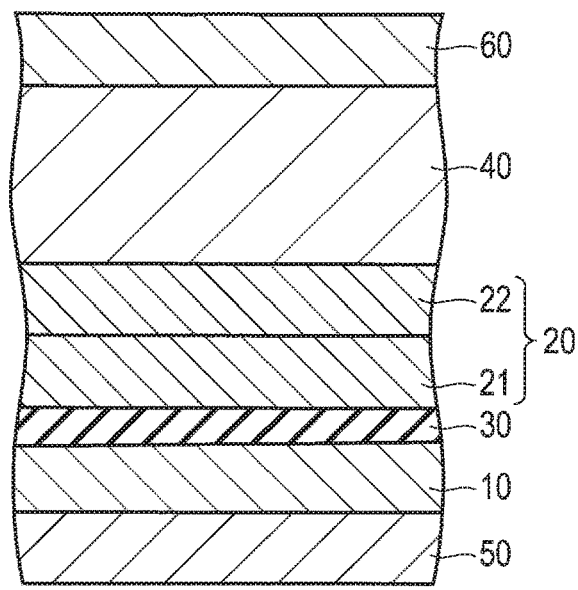
FIG. 1 is a cross-sectional view schematically showing the fundamental configuration of a magnetoresistive element in a magnetic memory device according to an embodiment.

FIG. 1 is a cross-sectional view schematically showing the fundamental configuration of a magnetoresistive element in a magnetic memory device according to an embodiment. It should be noted that the magnetoresistive element is also called a magnetic tunnel junction (MTJ) element.

The magnetoresistive element shown in FIG. 1 is a spin transfer torque (STT) magnetoresistive element having perpendicular magnetization and includes a first magnetic layer 10, second magnetic layer 20, nonmagnetic layer 30 interposed between the first magnetic layer 10 and second magnetic layer 20, third magnetic layer 40, under layer 50, and cap layer 60.

In the magnetoresistive element shown in FIG. 1, the first magnetic layer 10, nonmagnetic layer 30, and second magnetic layer 20 are stacked one on top of the other in this order from the substrate side on which the device is formed. A magnetoresistive element having such a stacked configuration is called a bottom storage layer magnetoresistive element. As will be described later, a magnetic layer the magnetization direction of which is variable like the first magnetic layer 10 is called a storage layer, and magnetic layer having a fixed magnetization direction like the second magnetic layer 20 is called a reference layer. A magnetoresistive element having a configuration in which the second magnetic layer 20, nonmagnetic layer 30, and first magnetic layer 10 are stacked oppositely in this order from the substrate side is called a top storage layer magnetoresistive element. The magnetoresistive element of this embodiment is not limited to the bottom storage layer magnetoresistive element shown in FIG. 1, and can also be applied to the top storage layer magnetoresistive element.

The first magnetic layer 10 has a variable magnetization direction and functions as a storage layer of the magnetoresistive element. That the magnetization direction is variable implies that the magnetization direction changes with respect to a predetermined write current. The first magnetic layer 10 contains therein at least iron (Fe) and boron (B). The first magnetic layer 10 may further contain therein cobalt (Co) in addition to iron (Fe) and boron (B). This first magnetic layer 10 will be described later in detail. In general, the first magnetic layer is configured in a single layer.

The second magnetic layer 20 has a fixed magnetization direction and functions as a reference layer of the magnetoresistive element. That the magnetization direction is fixed implies that the magnetization direction does not change with respect to a predetermined write current. The second magnetic layer 20 includes a first sub-magnetic layer 21 and second sub-magnetic layer 22. Here, the first sub-magnetic layer 21 is called an interface reference layer and second sub-magnetic layer 22 is called a sub-reference layer. The first sub-magnetic layer 21 contains therein at least iron (Fe) and boron (B). The first sub-magnetic layer 21 may further contain therein cobalt (Co) in addition to iron (Fe) and boron (B). The second sub-magnetic layer 22 contains therein cobalt (Co) and at least one element selected from platinum (Pt), nickel (Ni), and palladium (Pd).

The nonmagnetic layer 30 is interposed between the first magnetic layer 21 and second magnetic layer 22 and functions as a tunnel barrier layer of the magnetoresistive element. The nonmagnetic layer 30 contains therein magnesium (Mg) and oxygen (O). The MgO film has the NaCl structure as the crystalline structure. Further, in order to obtain a tunnel magnetoresistive ratio of 10% or more, a (001) oriented MgO film is used. Besides, as the nonmagnetic layer 30, MgAlO or the like constituted of magnesium (Mg), aluminum (Al), and oxygen (O) is used.

The third magnetic layer 40 has a fixed magnetization direction antiparallel to the magnetization direction of the second magnetic layer 20. The third magnetic layer 40 is configured to cancel a magnetic field to be applied from the second magnetic layer 20 to the first magnetic layer 10 and functions as a shift-canceling layer of the magnetoresistive element. The third magnetic layer 40 contains therein cobalt (Co) and at least one element selected from platinum (Pt), nickel (Ni), and palladium (Pd).

The under layer 50 is provided under the first magnetic layer 10. The under layer 50 is formed of magnesium oxide, magnesium nitride, zirconium nitride, niobium nitride, silicon nitride, aluminum nitride, hafnium nitride, tantalum nitride, tungsten nitride, chromium nitride, molybdenum nitride, titanium nitride, vanadium nitride or the like.

The cap layer 60 is provided on the third magnetic layer 40. The cap layer 60 is formed of platinum, tungsten, tantalum, ruthenium or the like.

When the magnetization direction of the storage layer 10 is parallel to the magnetization direction of the reference layer 20, the magnetoresistive element is in the low-resistance state and, when the magnetization direction of the storage layer 10 is antiparallel to the magnetization direction of the reference layer 20, the magnetoresistive element is in the high-resistance state. Accordingly, binary data (0 or 1) can be stored according to the resistance state (low-resistance state and high-resistance state) of the magnetoresistive element. Further, the binary data can be set according to the direction of the write current.

It should be noted that in the example shown in FIG. 1, the stacked structure of the first magnetic layer 10, second magnetic layer 20, and nonmagnetic layer 30 is a structure formed by stacking, from the lower layer side, in the order of the first magnetic layer 10, nonmagnetic layer 30, and second magnetic layer 20. It should be noted that in the case of a structure formed by stacking, from the lower layer side, oppositely in the order of the second magnetic layer 20, nonmagnetic layer 30, and first magnetic layer 10, the structure can also be applied to the embodiment to be described later.

Figure 2:
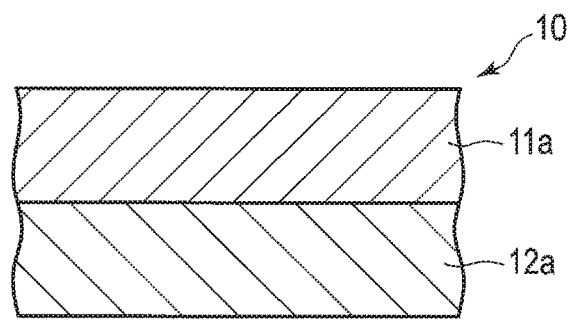
FIG. 2 is a cross-sectional view schematically showing a first configuration example of a first magnetic layer in the magnetic memory device according to the embodiment.

FIG. 2 is a cross-sectional view schematically showing a first configuration example of the first magnetic layer (storage layer) 10 shown in FIG. 1.

As will be described in the following, throughout the embodiment, the first magnetic layer 10 includes a crystallographically heterogeneous first sub-magnetic layer 11 and crystallographically homogeneous and continuous second sub-magnetic layer 12. That is, by the effect of stacking the heterogeneous layer and homogeneous layer, desired characteristics can be obtained.

The first magnetic layer 10 of this configuration example includes a first sub-magnetic layer 11a in the polycrystalline state and second sub-magnetic layer 12a in the amorphous state. Furthermore, the first magnetic layer 10 of this configuration example includes the first sub-magnetic layer 11a constituted of a heterogeneous polycrystal and homogeneous second sub-magnetic layer 12a in the amorphous state. The first sub-magnetic layer 11a is provided on the nonmagnetic layer 30 side, and second sub-magnetic layer 12a is provided on the under layer 50 side. That is, the first sub-magnetic layer 11a is provided between the nonmagnetic layer 30 and second sub-magnetic layer 12a. The thickness of the first sub-magnetic layer 11a may be less than the thickness of the second sub-magnetic layer 12a. Here, each of the film thicknesses of the polycrystalline first sub-magnetic layer 11a and second sub-magnetic layer 12a in the amorphous state is defined as an average film thickness in each phase state. That is, the amorphous part may exist in the polycrystalline first sub-magnetic layer 11a, and the crystalline phase may exist in the second sub-magnetic layer 12a in the amorphous state. In order to maximize the MR ratio, it is desirable that 50% or more of the first sub-magnetic layer 11a be crystallized and, it is more desirable that 80% or more thereof be crystallized. However, it is necessary that the amorphous layer should continuously exist.

The aforementioned first magnetic layer 10 can be formed by forming a CoFeB layer for the first magnetic layer 10 on the under layer 50 by sputtering and, thereafter annealing the CoFeB layer under predetermined annealing conditions (annealing temperature, annealing time, and the like).

By using the first magnetic layer 10 having the above-mentioned configuration, it is possible to obtain a magnetic memory device in which variation or the like in write current is reduced. As a result, it becomes possible to reduce the write error rate (WER). Descriptions will be given below.

A sample subjected to annealing at 325° C. was prepared as the sample of this embodiment, and sample subjected to annealing at 475° C. was prepared as the sample of a comparative example. In the sample of the comparative example, the whole of the first magnetic layer 10 is in the polycrystalline state.

When the sample of this embodiment and sample of the comparative example were compared with each other, it was confirmed that the sample of this embodiment showed less variation in the write current than the sample of the comparative example. Further, it was confirmed that the sample of this embodiment showed less variation also in the element resistance, MR ratio, coercive force Hc, and thermal stability energy $\Delta E$.

In order to obtain an excellent magnetoresistive element having a high MR ratio or the like, it is desirable that the first magnetic layer 10 and second magnetic layer 20 should each have a crystalline state. In this configuration example, the first sub-magnetic layer 11a of the first magnetic layer 10 is in the polycrystalline state, and hence, in order to obtain a high MR ratio, the first sub-magnetic layer 11a is effective. However, with the first magnetic layer 10 in the polycrystalline state, traps are liable to occur at crystal grain boundaries. Accordingly, there is a possibility of variation in characteristics occurring due to such traps. On the other hand, with the second sub-magnetic layer 12a in the amorphous state, no traps occur at crystal grain boundaries. Accordingly, in order to reduce variation in characteristics (variation in write current or the like), the second sub-magnetic layer 12a is effective. In this configuration example, the first magnetic layer 10 includes the first sub-magnetic layer 11a in the polycrystalline state and second sub-magnetic layer 12a in the amorphous state, and hence it is possible to obtain a magnetoresistive element which has characteristics excellent in the MR ratio or the like and in which variation in characteristics (variation in write current or the like) is reduced.

The first sub-magnetic layer 11a in the polycrystalline state and second sub-magnetic layer 12a in the amorphous state have a stacked structure, but have unevenness in the boundary region, and hence, it cannot always be said that a distinct interface is formed around the structure. Here, the second sub-magnetic layer 12a in the amorphous state is defined as a layer having a crystal grain size (grain diameter) less than 1 nm. The first sub-magnetic layer 11a is polycrystalline and has a crystal grain size of 3 to 10 nm. These crystalline states can be distinguished by the bright-field image and dark-field image in the cross-sectional transmission electron microscopy observation or by a radial distribution function obtained by nano EDX or XAFS using the same sample. Here, as the "crystal grain size", an average value of individual crystal grain sizes is used.

Further, the crystal grain size of the polycrystalline first sub-magnetic layer 11a is equal to the crystal grain size of the nonmagnetic layer 30 in many cases. Particularly, when a tunnel barrier layer such as the MgO (001) layer or MgAlO (001) layer is used, the first sub-magnetic layer 11a is obtained by crystallization from the tunnel barrier layer side, and hence the crystal grain size of the first sub-magnetic layer 11a and crystal grain size of the tunnel barrier layer become equal to each other.

Further, in order to reduce the variation in characteristics (variation in write current or the like), it is important to suppress variation in magnetization reversal in domain wall motion type magnetization reversal. For that purpose, it is desirable that the domain wall be wide (effective perpendicular magnetization anisotropy be small). In this configuration example, the second sub-magnetic layer 12a in the amorphous state has a wide domain wall, and hence it is possible to reduce the variation in characteristics by the second sub-magnetic layer 12a.

Regarding the thickness balance between the first sub-magnetic layer 11a and second sub-magnetic layer 12a, for the sake of the large MR ratio, it is sufficient if the polycrystalline first sub-magnetic layer 11a exists in an amount greater than or equal to one atomic layer. That is, it is sufficient if a crystalline layer (first sub-magnetic layer 11a) of 0.3 nm or more exists, and a crystalline layer of 0.5 nm or more is more desirable. Here, the interface between the first sub-magnetic layer 11a and second sub-magnetic layer 12a is extremely indistinct, and hence, here, the average film thickness of the individual layers is defined as the film thickness. Accordingly, the whole of the first sub-magnetic layer 11a may not necessarily be crystallized, and the crystalline phase may discontinuously exist. That is, amorphous parts may locally exist in the first sub-magnetic layer 11a. However, in order that the amorphous layer can play an important role in maintaining the homogeneity and smooth moving of the domain wall, it is necessary that the second sub-magnetic layer 12a in the amorphous state should continuously exist. That is, the second sub-magnetic layer 12a which is the homogeneous layer in this case needs continuity. Further, when the first sub-magnetic layer 11a and second sub-magnetic layer 12a are formed of CoFeB, the composition ratio (atomic %) of B in the second sub-magnetic layer 12a is greater than the composition ratio (atomic %) of B of the first sub-magnetic layer 11a in many cases.

Figure 3:
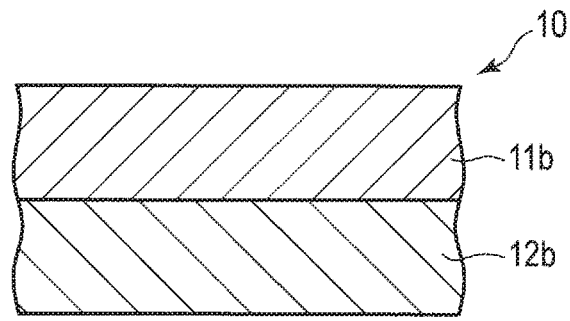
FIG. 3 is a cross-sectional view schematically showing a second configuration example of the first magnetic layer in the magnetic memory device according to the embodiment.

FIG. 3 is a cross-sectional view schematically showing a second configuration example of the first magnetic layer (storage layer) 10 shown in FIG. 1. It should be noted that the fundamental items are identical to the first configuration example, and hence descriptions of the items already described in the first configuration example are omitted.

The first magnetic layer 10 of this configuration example includes a first sub-magnetic layer lib in the polycrystalline state and second sub-magnetic layer 12b in the single crystalline state. The first sub-magnetic layer lib is provided on the nonmagnetic layer 30 side, and second sub-magnetic layer 12b is provided on the under layer 50 side. The thickness of the first sub-magnetic layer 11b may be less than the thickness of the second sub-magnetic layer 12b.

In this configuration example, the second sub-magnetic layer 12b is in the single crystalline state, and hence, in the second sub-magnetic layer 12b, no trap occurs at the crystal grain boundary. Accordingly, due to the reason identical to the reason described in the first configuration example, the second sub-magnetic layer 12b is effective in order to reduce the variation in characteristics. Further, in this configuration example, the second sub-magnetic layer 12b has a wide domain wall, and hence it is possible to reduce the variation in characteristics by the second sub-magnetic layer 12b due to the reason identical to the reason described in the first configuration example.

From the above description, in this configuration example too, as in the case of the first configuration example, it is possible to obtain a magnetoresistive element which has characteristics excellent in the MR ratio or the like and in which the variation in characteristics (variation in write current or the like) is reduced.

Figure 4:
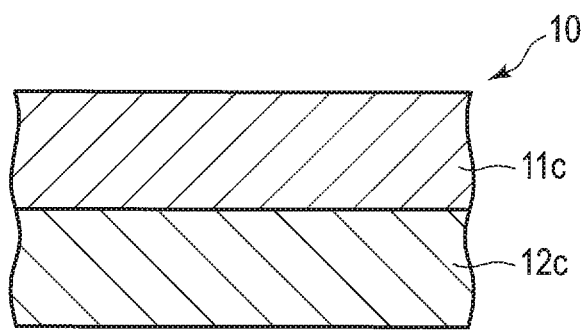
FIG. 4 is a cross-sectional view schematically showing a third configuration example of the first magnetic layer in the magnetic memory device according to the embodiment.

FIG. 4 is a cross-sectional view schematically showing a third configuration example of the first magnetic layer (storage layer) 10 shown in FIG. 1. It should be noted that the fundamental items are identical to the first configuration example, and hence descriptions of the items already described in the first configuration example are omitted.

The first magnetic layer 10 of this configuration example includes a first sub-magnetic layer 11c in the polycrystalline state and second sub-magnetic layer 12c in the polycrystalline state. The average grain size (average grain diameter) of the polycrystals included in the second sub-magnetic layer 12c is less than the average grain size (average grain diameter) of the polycrystals included in the first sub-magnetic layer 11c. The first sub-magnetic layer 11c is provided on the nonmagnetic layer 30 side, and second sub-magnetic layer 12c is provided on the under layer 50 side. The thickness of the first sub-magnetic layer 11c may be less than the thickness of the second sub-magnetic layer 12c. It is desirable that the crystal grain size of the first sub-magnetic layer 11c be less than 2 nm, and crystal grain size of the second sub-magnetic layer 12c be greater than or equal to 2 nm. This is because, when the TEM observation of a magnetoresistive element having large variation in magnetization reversal characteristics has been carried out, the storage layer has been constituted of crystal grains having a grain size greater than or equal to 3 nm.

In general, the greater the crystal grain size, the greater the inclination of the crystal grain boundary becomes. That is, in this case, a high-angle grain boundary is liable to be formed. In the vicinity of the crystal grain boundary, the exchange stiffness constant from which the exchange coupling energy originates becomes small. For this reason, the grain boundary energy becomes less, and the domain wall is stabilized, and hence the probability of the domain wall being trapped increases. In this configuration example, the average grain size of polycrystals included in the second sub-magnetic layer 12c is small, and hence a crystal grain boundary having a small inclination (low-angle grain boundary) is formed. In this case, the exchange stiffness constant in the vicinity of the crystal grain boundary is prevented from being lowered, and a change in the exchange stiffness constant becomes less at the crystal grain boundary and inside the crystal grain. As a result, it is possible to reduce the trapping probability at the crystal grain boundary of the second sub-magnetic layer 12c. Accordingly, the second sub-magnetic layer 12c is effective in order to reduce the variation in characteristics due to the reason identical to the reason described in the first configuration example. Further, in this configuration example too, the second sub-magnetic layer 12c has a wide domain wall, and it is possible to reduce the variation in magnetization reversal characteristics by the second sub-magnetic layer 12c due to the reason identical to the reason described in the first configuration example.

From the above description, in this configuration example too, as in the case of the first configuration example, it is possible to obtain a magnetoresistive element which has characteristics excellent in the MR ratio or the like and in which the variation in characteristics (variation in write current or the like) is reduced.

Figure 5:
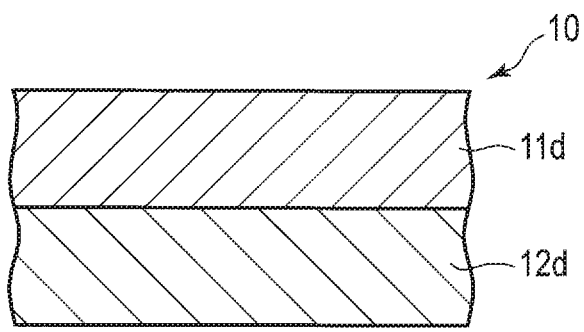
FIG. 5 is a cross-sectional view schematically showing a fourth configuration example of the first magnetic layer in the magnetic memory device according to the embodiment.

FIG. 5 is a cross-sectional view schematically showing a fourth configuration example of the first magnetic layer (storage layer) 10 shown in FIG. 1. It should be noted that the fundamental items are identical to the first configuration example, and hence descriptions of the items already described in the first configuration example are omitted.

The first magnetic layer 10 of this configuration example includes a first sub-magnetic layer 11d in the crystalline state (for example, polycrystalline state) and second sub-magnetic layer 12d in the crystalline state (for example, polycrystalline state). The second sub-magnetic layer 12d has lower crystal orientation than the first sub-magnetic layer 11d. The first sub-magnetic layer 11d is provided on the nonmagnetic layer 30 side, and second sub-magnetic layer 12d is provided on the under layer 50 side. The thickness of the first sub-magnetic layer 11d may be less than the thickness of the second sub-magnetic layer 12d. When the first sub-magnetic layer 11d and second sub-magnetic layer 12d are formed of CoFeB, the crystallized CoFeB has the BCC structure and is (001) oriented. Accordingly, the aforementioned low crystal orientation and high crystal orientation can be determined on the basis of the magnitude relationship of the crystal orientation by the half-width of the rocking curve of the (001) peak from the analysis based on XRD.

Further, in the case of the polycrystalline thin film, the crystal orientation is in correlation with the crystal grain size and, a thin film having a large crystal grain size tends to have low crystal orientation, and thin film having a small crystal grain size tends to have high crystal orientation in many cases. In this case, the example shown in FIG. 4 and example shown in FIG. 5 are in correlation with each other, and both the examples simultaneously satisfy the condition.

In this configuration example, the second sub-magnetic layer 12d has low crystal orientation. For this reason, it is possible to widen (lessen the effective perpendicular magnetization anisotropy) the domain wall width of the second sub-magnetic layer 12d. Accordingly, it is possible to reduce the variation in characteristics by the second sub-magnetic layer 12d due to the effect of stacking the homogeneous layer and heterogeneous layer, the effect being identical to the reason described in the first configuration example.

From the above description, in this configuration example too, as in the case of the first configuration example, it is possible to obtain a magnetoresistive element which has characteristics excellent in the MR ratio or the like and in which the variation in characteristics (variation in write current or the like) is reduced.

It should be noted that in the above-mentioned first to fourth configuration examples, although the first sub-magnetic layer 11 (11a, 11b, 11c, 11d) is provided on the nonmagnetic layer 30 side, and second sub-magnetic layer 12 (12a, 12b, 12c, 12d) is provided on the under layer 50 side, oppositely, the first sub-magnetic layer 11 (11a, 11b, 11c, 11d) may be provided on the under layer layer 50 side, and second sub-magnetic layer 12 (12a, 12b, 12c, 12d) may be provided on the nonmagnetic layer 30 side.

Figure 6:
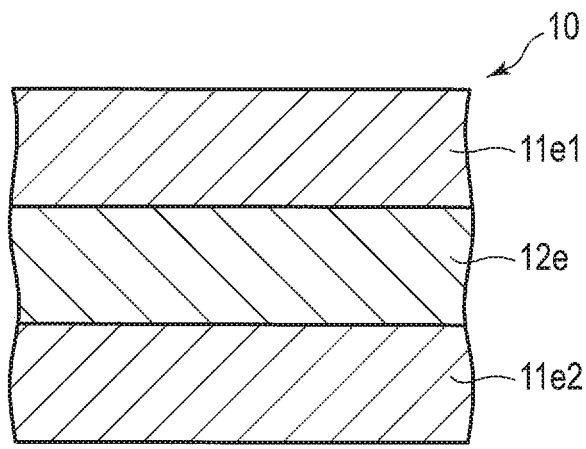
FIG. 6 is a cross-sectional view schematically showing a fifth configuration example of the first magnetic layer in the magnetic memory device according to the embodiment.

FIG. 6 is a cross-sectional view schematically showing a fifth configuration example of the first magnetic layer (storage layer) 10 shown in FIG. 1. It should be noted that the fundamental items are identical to the first configuration example, and hence descriptions of the items already described in the first configuration example are omitted.

In this configuration example, first sub-magnetic layers 11e1 and 11e2 are provided on both sides of a second sub-magnetic layer 12e. As the first sub-magnetic layers 11e1 and 11e2, magnetic layers identical to the first sub-magnetic layer 11a, 11b, 11c or 11d shown in the first to fourth configuration examples can be used. As the second sub-magnetic layer 12e, a magnetic layer identical to the second sub-magnetic layer 12a, 12b, 12c or 12d shown in the first to fourth configuration examples can be used. The thickness of the second sub-magnetic layer 12e is equal to or greater than the total thickness of the first sub-magnetic layers 11e1 and 11e2.

This configuration example also has a configuration identical to the configurations described in the first to fourth configuration examples, and hence advantages identical to the advantages described in the first to fourth configuration examples can be obtained.

In all the embodiments described above, the first magnetic layer 10 includes the crystallographically heterogeneous first sub-magnetic layer 11 and crystallographically homogeneous and continuous second sub-magnetic layer 12. That is, by the effect of stacking the heterogeneous layer and homogeneous layer, it becomes possible to obtain the desired characteristics.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory device comprising:
a first magnetic layer having a variable magnetization direction;
a second magnetic layer having a fixed magnetization direction;
a nonmagnetic layer provided between the first magnetic layer and the second magnetic layer; and
an under layer on which the first magnetic layer is provided,
wherein:
the first magnetic layer contains at least iron (Fe) and boron (B) and includes a first sub-magnetic layer in a polycrystalline state and a second sub-magnetic layer in an amorphous state,
a composition ratio (atomic %) of boron (B) in the second sub-magnetic layer is greater than a composition ratio (atomic %) of boron (B) in the first sub-magnetic layer, and
the second sub-magnetic layer is in direct contact with the under layer.

2. The device of claim 1, wherein the first sub-magnetic layer is provided between the nonmagnetic layer and the second sub-magnetic layer.

3. The device of claim 1, wherein the second sub-magnetic layer is thinner than the first sub-magnetic layer.

4. The device of claim 1, wherein the under layer contains a nitrogen compound or an oxygen compound.

5. A magnetic memory device comprising:
a first magnetic layer having a variable magnetization direction;

a second magnetic layer having a fixed magnetization direction; and a nonmagnetic layer provided between the first magnetic layer and the second magnetic layer, wherein:

the first magnetic layer includes a first sub-magnetic layer in a polycrystalline state and a second sub-magnetic layer in a single crystalline state, and the first sub-magnetic layer and the second sub-magnetic layer are provided continuously without any nonmagnetic layer interposed therebetween.

6. The device of claim 5, wherein the first sub-magnetic layer is provided between the nonmagnetic layer and the second sub-magnetic layer.

7. The device of claim 5, wherein the second sub-magnetic layer is thinner than the first sub-magnetic layer.

8. The device of claim 5, wherein the first magnetic layer contains at least iron (Fe) and boron (B).

9. A magnetic memory device comprising:

a first magnetic layer having a variable magnetization direction;

a second magnetic layer having a fixed magnetization direction; and a nonmagnetic layer provided between the first magnetic layer and the second magnetic layer, wherein:

the first magnetic layer includes a first sub-magnetic layer in a polycrystalline state and a second sub-magnetic layer in a polycrystalline state, an average grain size of polycrystals included in the second sub-magnetic layer is less than an average grain size of polycrystals included in the first sub-magnetic layer, and the first sub-magnetic layer and the second sub-magnetic layer are provided continuously without any nonmagnetic layer interposed therebetween.

10. The device of claim 9, wherein the first sub-magnetic layer is provided between the nonmagnetic layer and the second sub-magnetic layer.

11. The device of claim 9, wherein the second sub-magnetic layer is thinner than the first sub-magnetic layer.

12. The device of claim 9, wherein the first magnetic layer contains at least iron (Fe) and boron (B).

13. A magnetic memory device comprising:

a first magnetic layer having a variable magnetization direction;

a second magnetic layer having a fixed magnetization direction; and a nonmagnetic layer provided between the first magnetic layer and the second magnetic layer, wherein:

the first magnetic layer includes a first sub-magnetic layer in a crystalline state and a second sub-magnetic layer in a crystalline state, and the second sub-magnetic layer has lower crystal orientation than the first sub-magnetic layer.

14. The device of claim 13, wherein the first sub-magnetic layer is provided between the nonmagnetic layer and the second sub-magnetic layer.

15. The device of claim 13, wherein the second sub-magnetic layer is thinner than the first sub-magnetic layer.

16. The device of claim 13, wherein the first magnetic layer contains at least iron (Fe) and boron (B).

* * * * *